United States Patent [19]

Jacob

[11] 4,093,704

[45] June 6, 1978

[54] METHOD FOR SYNTHESIS OF III-V COMPOUNDS

[75] Inventor: Guy Michel Jacob, Creteil, France

[73] Assignee: U.S. Philips Corporation, New York, N.Y.

[21] Appl. No.: 732,735

[22] Filed: Oct. 15, 1976

Related U.S. Application Data

[63] Continuation of Ser. No. 541,436, Jan. 16, 1975, abandoned.

[30] Foreign Application Priority Data

Jan. 16, 1974 France .................................. 74 01402

[51] Int. Cl.² .................. C01B 25/00; C22C 28/00; C22C 30/00
[52] U.S. Cl. .................................. 423/299; 75/134 T
[58] Field of Search .............. 423/299, 406, 409, 412; 75/134 T, 149, 34 D

[56] References Cited

U.S. PATENT DOCUMENTS

| | | | |
|---|---|---|---|
| 3,340,009 | 9/1967 | Wenzet et al. | 423/299 |
| 3,366,454 | 1/1968 | Folberth et al. | 423/299 |
| 3,690,846 | 9/1972 | Akai et al. | 423/299 |
| 3,899,572 | 8/1975 | Wanatabe et al. | 423/299 |

*Primary Examiner*—O. R. Vertiz
*Assistant Examiner*—Gregory A. Heller
*Attorney, Agent, or Firm*—Frank R. Trifari; Norman N. Spain

[57] ABSTRACT

The invention relates to a method for the synthesis of a semiconductor compound comprising at least one element of column III of the periodic table of Mendeleev, and an element of column V having a vapor pressure higher than that of element(s) III at the synthesis temperature of the said compound, and according to which, in a closed space, a liquid mass of element(s) III, placed in a first zone of said space which is heated at relatively high temperatures and is contacted with vapors obtained by evaporation of element V, said element V being placed in a second zone of the said space in a non-gaseous form, the evaporation temperature of element V being higher than that of the coldest point provided in a third zone of the said space, and the said first zone being situated between the second and the third zone.

9 Claims, 4 Drawing Figures

METHOD FOR SYNTHESIS OF III-V COMPOUNDS

This is a continuation of application Ser. No. 541,436, filed Jan. 16, 1975 now abandoned.

It is known that certain semiconductor compounds are difficult to obtain in satisfactory quality by the methods conventionally used. This is due to the fact that their melting temperature and/or their dissociation pressure at the melting temperature are very high; this is the case particularly for gallium phosphide (GaP) and gallium arsenide, GaAs.

According to a known synthesis method, in order to obtain a compound in the form of a rod of high purity, a mass of solution in the liquid phase having one of the components as a solvent, for example, gallium in the case of gallium phosphide or gallium arsenide, to which the other component is supplied from the vapour phase, is submitted to a temperature gradient such that the crystallization of the compound is produced progressively starting from the coldest point of the said mass.

This method may be carried out in a sealed tube by direct reaction of one of the components brought into its gaseous phase and directed on to the liquid mass of the other component.

This method is time-consuming and consequently very expensive due to the slowness of bringing the appropriate component into a gaseous form. Furthermore it is known that the vapours of the elements of column V, notably those of phosphorus, are dangerous and that their use necessitates a certain number of precautions; it is therefore endeavoured in particular to avoid damage of the walls enclosing the space by using low pressures and slow evaporation rates.

Likewise, methods of the type described in the United States Patent Specification No. 2,921,905 using an atmosphere the pressure of which is equal to the vapour pressure of the volatile element in equilibrium with a liquid mass of the compound at its melting temperature, cannot be used without danger and without expensive and complex apparatus for the preparation of III–V compounds in which the volatile element has very high vapour pressures.

The present invention has mainly for its object to avoid the drawbacks of the said methods particularly avoiding the use of high pressures, while permitting a rapid synthesis.

Another object of the invention is to make the operation of the synthesis reproducible, by eliminating the uncertainties due to the variations of the evaporation conditions of a volatile element.

According to the present invention a method for the synthesis of a semiconductor compound comprising at least one element of column III of the periodic table of Mendeleov, and an element of column V having a vapour pressure higher than that of the element(s) III at the synthesis temperature of the said compound, and according to which, in a closed space, a liquid mass of element(s) III is placed in a first zone of said space which is heated at relatively high temperatures and is contacted with vapours obtained by evaporation of element V, said element V being placed in a second zone of the said space in a non-gaseous form, the evaporation temperature of element V being higher than that of the coldest point provided in a third zone of the said space, and the said first zone being situated between the second and the third zone, is characterized in that the evaporation temperature is sufficiently high in order that, under the vapour pressure of the element V in the space determined by the temperature of the coldest point, the amount of evaporated element V be higher than the amount of it being absorbed in the said liquid mass, the totality of the said liquid mass being subjected to a temperature field having temperature gradients, and in that, after evaporation of the totality of the element V placed in the second zone, the temperature of the third and of the second zone are reversed and the condensates of element V formed in the third zone are evaporated, the transport operation of vapours of element V between the third and the second zone being repeated.

Preferably, the transport operation of vapours of element V between the third and the second zone is repeated until exhaustion of the element V.

According to a preferred embodiment, the temperature of the coldest point is set to a value so as to maintain in the space a vapour pressure of the element V at least equal to the vapour pressure of said element in equilibrium with a liquid saturated solution of the compound in the element(s) III at a temperature T which is substantially lower than the melting temperature of the compound, T being the highest temperature in the said first zone.

In the method according to the invention, the mass of the element V is placed at a temperature higher than that of the coldest point, which augments the supply of evaporation causing a more rapid synthesis when comparing with known methods in which mass of the element V having an equal evaporation surface, is situated in the zone of lower temperature.

Moreover, the vapour pressure of the said element V in the space is constantly controlled by the temperature of the coldest point due to the fact that the supply of evaporation of said element is higher than the amounts of it absorped in the liquid mass of element(s) III. The amounts of vapour of element V absorbed in the liquid mass being dependent on the pressure of the said vapour, the control of said pressure by the temperature of a cold point ameliorates the reproducibility of the operation by making it independent of the evaporation conditions and notably of the physical characteristics of the source of element V.

Owing to the respective positions of the element V and of the cold point of the space, a transport of the said element V is obtained from the part of the space where it is placed towards the cold point passing over the boat or boats containing the liquid mass of element(s) III which absorbs a part of the vapours of element V. Owing to the temperature gradient in the liquid mass, a continuous diffusion occurs in the liquid crystallization of the compound proceeding from the coldest point of the liquid mass.

The temperature T of the hottest point of the liquid mass is considerably below the melting temperature of the compound, the equilibrium vapour pressure being lower too. In the case of gallium phosphide, for example, it is possible to fix a temperature T of the order of 1200° C for which the equilibrium pressure of the phosphorus vapour above a saturated solution is lower than one atmosphere.

For carrying out the synthesis reaction, the method according to the invention takes into account a condensation of the element V not absorbed during the passage above the boat in the coldest zone and the transport sense of element V is reversed at least once.

The successive passages of the vapour of elements V above the liquid mass of element III, which permit of choosing a high evaporation temperature, and hence a high supply of vapour, render the efficiency of operation optimum, by evaporating until the very last traces of element V.

So in the case of the synthesis of gallium phosphide, for example, the remainder of phosphorus which deposits in the coldest zone is again brought at its evaporation temperature and is returned to the other end of the space (which has then become the coldest point) while passing over the boat or boats containing the liquid mass of solution in gallium subsisting on the side of the crystallized compound.

The chosen difference between the evaporation temperature of element V and the temperature of the coldest point of the space depends on the elements present. In the example of phosphorus and of gallium said difference may be chosen between 20° and 200° C and preferably between 80° and 150° C.

Preferably the temperature gradients in the liquid mass are given substantially high value ameliorating the diffusion rate of the element V in said liquid mass and thus ameliorating the crystallization rate. For example, in the case of phosphorus diffusing in gallium, it may be envisaged to use a boat of at least 15 cm length which is subjected to a temperature varying from 900° C to 1200° C between its two extremities, for example, a gradient of at least 20° C/cm.

Due to the necessary presence along the space of a field of temperatures having two types temperature gradients, one type of gradients between the evaporation zone and the temperature point T and a reversed type of gradients to the temperature of the cold point of the space, it is advantageous that the liquid mass is subjected to a symmetric field of temperatures having symmetrically distributed temperature gradients in the high temperature range and it is advantageous to distribute the liquid mass over two boats each boat being positioned in each half of said symmetric field. In this case, in the same operation, the quantity of compound obtained is doubled, for it has been found experimentally that the synthesis reaction is practically the same in the two boats.

In order to augment the quantity of compound produced and to guarantee a quasi total transformation of the liquid mass, a succession of about symmetrically distributed temperature gradients may be realized in the space by making a boat correspond to each portion of the temperature field having a uniform sense of the temperature gradients. Of course the temperatures are chosen such that except the two extremities of the space, any point in the space cannot constitute a cold point.

According to a special form of the method according to the invention a space is used having longitudinally four successive zones, the zone called second zone where a solid or liquid charge of the element V is placed, the zone called first zone where the liquid mass of element(s) III is placed, a supplementary zone where also a liquid mass of element(s) III is placed, and the zone called third zone zone comprising the coldest point in the first stage of the operation.

In a first stage, the second zone is heated to the evaporation temperature of the element V, the third zone is heated to the temperature determining the vapour pressure of the element V in the space, the first zone is subjected to the crystallization gradients and the supplementary zone or fourth zone is heated to a temperature lower than that of the first zone and advantageously of the order of that of the second zone but higher than that of the cold point. Evaporation of the element V is carried out and the transport of the whole of said element is effected. The undesired impurities which are nonvolatile at the evaporation temperature of the element V remain in place and the undesired impurities which are volatile at said same temperature diffuse rapidly, with the said element V, in the liquid mass placed in the first zone, for, since they are in a low concentration, they are much below their solubility limit.

The element V which condenses in the third zone is also very pure. The fourth zone is then subjected in its turn to the crystallization gradients and the direction of transport of the element V is reversed. The compound formed in the fourth zone hence is of a very high purity.

The present invention relates in particular to the synthesis of gallium phosphide starting from a mass of gallium subjected to a temperature gradient varying, for example, between 900° and 1200° C and from a phosphorus charge evaporated at a temperature preferably between 480° and 580° C and transported towards the cold point of the space heated at a temperature preferably between 400° and 430° C.

The present invention can be applied to the synthesis of solid crystals of so-called III–V semiconductor compounds, for example, GaP, GaAs, InP, InAs, directly starting from their elements.

The invention will be described in greater detail with reference to the accompanying drawing, in which FIG. 1 shows diagrammatically a device for carrying out an embodiment of the method according to the invention.

The description relates, by way of example, to the synthesis of solid crystals of gallium phosphide.

Figure 1:
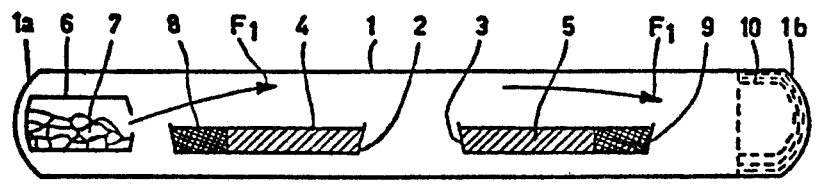

Referring now to FIG. 1, in a space 1, a sealed tube, for example, of quartz, two oblong boats 2 and 3 are placed containing masses 4 and 5 of gallium in a liquid form. At one extremity 1a of the space 1 is provided, for example, an open container 6 containing solid phosphorus 7.

Figure 2:
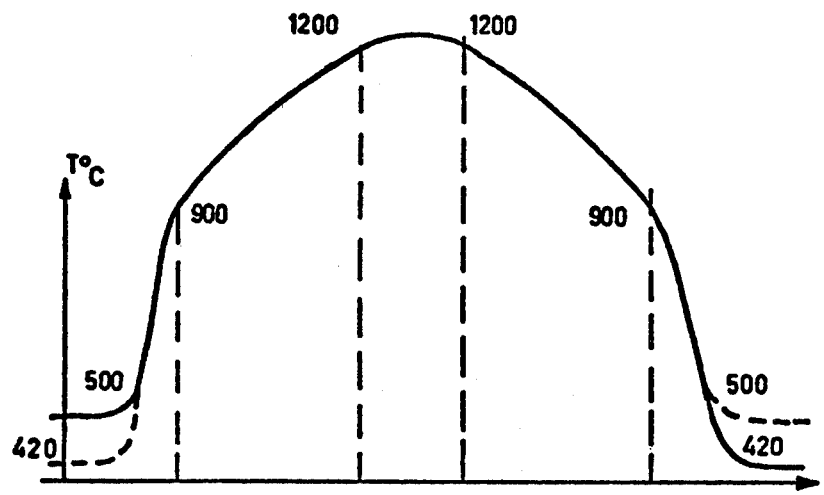
FIG. 2 shows the temperature curve along the reaction space shown in FIG. 1.

The tube 1 is subjected to the thermal rays of a furnace which is not shown in the Fig. but which is controlled in order that the temperature curves of the space 1 are those shown in a solid line in FIG. 2. In conformity with said Figure, the boats 2 and 3 present in the high temperature zone of the tube 1 are subjected to a temperature gradient from 900° to 1200° C.

The maintenance of the pressure in the tube 1 is ensured by the invariability of the temperature of a zone of a cold point constituted at the extremity 1b of the tube 1 opposite to the extremity 1a, said extremity 1a limiting itself a temperature zone maintained at the temperature chosen for the sublimation of the phosphorus 7.

Taking into account the melting or evaporation temperatures of the various elements, the temperature gradients in the high temperature zone are chosen to have a substantially high value the temperatures of said zone proceeding from 900° to 1200° C over a relatively short distance. The temperature of the zone of the cold point, generally between 400° and 430° C, advantageously 420° C, permits of maintaining a pressure of substantially 1 atmosphere in the space 1.

As regards the sublimation zone, the value of its temperature is set for the evaporation of the phosphorus 7; It may be chosen in a range which is sufficiently large, 480° to 580° C, and advantageously in the proximity of 500° C.

During the first stage of the synthesis operation, the phosphorus 7 situated at the extremity 1a of the space 1 is transformed in vapour and is drawn along towards the opposite extremity 1b of the said space 1 of which the temperature is lower.

The phosphorus in the gaseous form loses volatile impurities at 500° C and follows the track denoted by the arrows F1 while brushing the surface of the gallium masses 4 and 5 part of the phosphorus being absorbed in it diffusing in the liquid under the effect of the temperature gradients, solid masses 8 and 9 of gallium phosphide being crystallized. The remainder 10 of phosphorus then condenses and deposits on the walls of the cold extremity 1b of the space 1.

In a second stage, the temperature of the zone of extremity 1b is heated to 500° C and the temperature of the zone of extremity 1a is lowered to 420° C. The transport of phosphorus then occurs in the direction opposite to the preceding one, the absorption of phosphorus vapour by the liquid continuing, as well as the diffusion of phosphorus in the liquid and the crystallization. It is possible that after this there-and-back operation there is no longer any phosphorus condensation. Otherwise, the preceding operation is repeated until exhaustion of the phosphorus, or, if the quantity of phosphorus used is superfluous, until nearly total crystallization of the contents of the boats.

Figure 3:
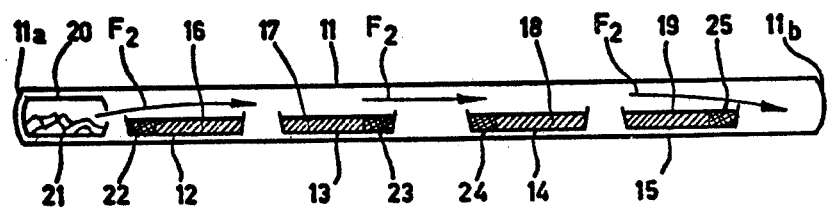
FIG. 3 shows diagrammatically a device for carrying out another embodiment of the method according to the invention the corresponding temperature curve of which is shown in FIG. 4.
Figure 4:
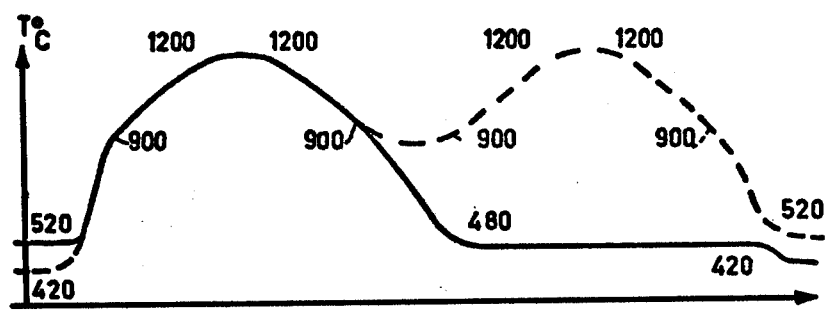

FIGS. 3 and 4 show a variation of the embodiment of the method destined to obtain a mass of purer gallium phosphide.

According to said Figures, in a hermetically sealed space 11, for example, a sealed quartz tube, there are provided on the one hand boats 12, 13, 14, 15 containing respectively masses of gallium 16, 17, 18, 19 and, on the other hand, a container 20 containing phosphorus 21 in its solid form disposed at the extremity 11a of the space 11.

The phosphorus 21 in the container 20 in a second zone at the extremity 11a of the space 11 is heated to a temperature of approximately 520° C which permits of converting it into its gaseous phase and making it flow in the length of the space 11 according to the arrows F2 up to a third zone comprising the extremity 11b of the space 11 heated to 420° C.

During the flow of the phosphorus vapours, the boats 12 and 13 in a first zone are subjected to a field of temperatures having symmetrically distributed temperatures varying from 900° to 1200° C according to the solid-line-curve of FIG. 4.

The gradients in said field of temperatures permit of creating GaP crystal masses 22, 23, 24 and 25.

The boats 14 and 15 in a fourth zone are maintained at a temperature of 480° C.

It is to be noted that in the zones of the boats the temperature must never become lower than the value of the temperature of the zone of the cold point so as not to create another cold point in the space 11.

Any impurities volatile at 520° C which may happen to be present in the phosphorus are drawn along with the phosphorus vapours. Since they are present in said vapours in a low concentration, they are very much below their solubility limit in the liquid of the boats 12 and 13 and are rapidly absorbed in it. This is the case notably for the impurity sulphur.

The transport of the phosphorus in the above conditions constitutes a first stage of the method in said particular embodiment.

When all the phosphorus has thus been evaporated, a large portion is condensed in the third zone comprising the extremity 11b and a portion is absorbed in the boats 12 and 13. Since the impurities volatile at 520° C are also absorbed in the boats 12 and 13, the phosphorus condensed at 11b is very pure. In a second stage the temperature profile of the space is modified according to the broken-line-curve of FIG. 4. The liquid of the boats 14 and 15 thus absorbs a very pure phosphorus and produces a high-purity phosphide.

The gallium phosphide collected in the boats 12 and 13 may serve the current uses, that which is collected in the boats 14 and 15 may serve for uses requiring a high purity.

What is claimed is:

1. A method for the synthesis of a III–V semiconductor compound, wherein the group III element is selected from the group consisting of gallium and indium and the group V element is selected from the group consisting of phosphorus and arsenic, the group V element having a vapor pressure higher than that of the group III element at the synthesis temperature of said compound, said method comprising: placing in a first zone in a reaction vessel the group V element in non-gaseous form, placing in a second zone, in said reaction vessel, adjacent to said first zone, the group III element in liquid form, providing a third zone in said reaction vessel adjacent to said second zone and remote from said first zone, closing said reaction vessel, providing a temperature in said first zone higher than the evaporation temperature of said group V element, providing a temperature in said second zone higher than the liquifying temperature of said group III element but below the melting temperature of said III–V compound, the temperature in said second zone being substantially higher than the temperature in said first zone; providing a temperature in said third zone sufficiently low to cause condensation of said group V element in said third zone and sufficiently below the temperature in said first zone to cause a larger quantity of said group V element to be evaporated than is absorbed in said group III element liquid, maintaining said temperatures in said zones until all of said group V element in said first zone has evaporated and then reversing the temperatures in said first and third zones until all of the V element condensed in said third zone has evaporated.

2. The method of claim 1 wherein the lowest temperature in said third zone has a value such that there is maintained in said reaction vessel a vapor pressure of the group V element at least equal to the vapor pressure of said element when in equilibrium with a liquid saturated solution of said III–V compound in said group III element at a temperature T substantially lower than the melting temperature of said compound, said temperature T being the highest temperature in said second zone.

3. The method of claim 2 wherein the temperatures in said first and third zones are reversed for a number of times sufficient to cause elimination of the V element.

4. The method of claim 2 wherein the temperatures are kept constant during the synthesis of the III–V compound.

5. The method of claim 4 wherein the group III element liquid is subjected to a symmetric field of temperatures having symmetrically distributed temperature gradients.

6. The method of claim 5 wherein the group III element liquid is distributed in two boats, each boat being positioned in each half of said symmetric field.

7. The method of claim 2 wherein part of said group III element liquid is positioned in a fourth zone between said second and said third zones, said fourth zone is subjected to a temperature in the order of that applied in said first zone until all of said group V element has evaporated and then reversing the temperature gradients between said second and fourth zones.

8. The method of claim 2 wherein the group III element is gallium and the group V element is phosphorus, a temperature gradient in the second zone of at least 20° per cm is present with a minimum temperature of 900° C and a maximum temperature of 1200° C.

9. The method of claim 8 wherein the difference between the temperature in the first and third zones is between 80° and 150° C.

* * * * *

UNITED STATES PATENT AND TRADEMARK OFFICE
CERTIFICATE OF CORRECTION

PATENT NO. : 4,093,704
DATED : June 6, 1978
INVENTOR(S) : GUY MICHEL JACOB

It is certified that error appears in the above-identified patent and that said Letters Patent are hereby corrected as shown below:

On the Title page:

Under "Foreign Application Priority Data" the number should be changed to --7401442--.

Signed and Sealed this

Eighth Day of May 1979

[SEAL]

Attest:

RUTH C. MASON
Attesting Officer

DONALD W. BANNER
Commissioner of Patents and Trademarks